United States Patent [19]
Kumagai et al.

[11] Patent Number: 6,100,720
[45] Date of Patent: Aug. 8, 2000

[54] LOW DISSIPATION INVERTER CIRCUIT

[75] Inventors: Kouichi Kumagai; Hiroaki Iwaki, both of Tokyo, Japan

[73] Assignee: NEC Corporation, Tokyo, Japan

[21] Appl. No.: 09/287,582

[22] Filed: Apr. 6, 1999

[30] Foreign Application Priority Data

Apr. 6, 1998 [JP] Japan ................................ 10-093246

[51] Int. Cl.⁷ ........................................... H03K 19/0948
[52] U.S. Cl. ........................... 326/121; 326/17; 326/83; 326/133
[58] Field of Search ................................ 326/112, 119, 326/121, 115, 130, 133, 17, 83, 86

[56] References Cited

U.S. PATENT DOCUMENTS 5,703,519  12/1997  Crook et al. ........................... 326/115
5,920,203   7/1999  Bailey et al. ............................ 326/83
5,935,203  12/1997  Nakashima .............................. 326/133

FOREIGN PATENT DOCUMENTS 62-64121   3/1987  Japan .
3-270266  12/1991  Japan .
4-241452   8/1992  Japan .
6-29834    2/1994  Japan .

Primary Examiner—Jon Santamauro
Attorney, Agent, or Firm—Young & Thompson

[57] ABSTRACT

An inverter circuit has first and second input terminals for receiving a complementary input signals, first and second output terminals for outputting a complementary output signals generated from the complementary input signals, and a pair of rectifier sections each for flowing the charge stored on a higher-potential side of the output terminals to a lower-potential said of the output terminals, for saving power dissipation.

8 Claims, 6 Drawing Sheets

LOW DISSIPATION INVERTER CIRCUIT

BACKGROUND OF THE INVENTION

(a) Field of the Invention

The present invention relates to a low dissipation inverter circuit and, more particularly, to an inverter circuit having a charge recovery function.

(b) Description of the Related Art

The recent design for large-scale semiconductor integrated circuit is generally based on synchronizing operation of the integrated circuit using a clock signal. There is a tendency that the clock signal line for propagating the clock signal has a larger parasitic capacitance. For this reason, the electric power consumed by charge/discharge of the clock signal line amounts as high as several watts, for example.

On the other hand, a semiconductor integrated circuit is known which has low-threshold MOS transistors in a logic circuit for operating the circuit at a high speed. However, the low-threshold transistors generally suffer from a problem of large penetrating current. In order to reduce the penetrating current flowing through the low-threshold MOS transistors, there is a proposal that the semiconductor integrated circuit have four source lines including global/local power lines and global/local ground lines. A high-threshold MOS transistor disposed between the global power line and the local power line or between the global ground line and the local ground line separates the local power line and the local ground line from the global power line and the global ground line, respectively, during a sleep mode of the semiconductor integrated circuit to reduce power dissipation.

In the proposed configuration, however, the high-threshold MOS transistor has a large gate width, which may amount to tens of millimeters, for example, or may amount to 10 to 30% of the total gate width of all the MOS transistors disposed in the logic circuit. The larger gate width MOS transistor in fact consumes large electric power, thereby limiting the amount of power saving.

In any case, the power saving is the most important subject for the semiconductor integrated circuits. In view of the power saving in the semiconductor integrated circuit, the present invention is to provide a low dissipation inverter circuit because the inverter circuit is one of the most fundamental circuit block used in the semiconductor integrated circuits for driving a large-capacitance load.

Referring to FIG. 1 showing a conventional inverter circuit, a first inverter section 21 and a second inverter section 22 are cascaded. The inverter circuit receives an input signal IN supplied through an input terminal 13, to output a pair of complementary signals including a non-inverting output signal OUT and an inverting output signal OUTB through respective output terminals 15 and 16.

In the inverter circuit of FIG. 1, a first case is assumed such that an input signal IN supplied to the input terminal 13 rises from a low level to a high level. The initial state of the inverter circuit is such that the input terminal 13 and the non-inverting output terminal 15 assume a low level, whereas the inverting output terminal 16 assumes a high level. After the input signal rises to a high level, nMOSFET MNC1 and pMOSFET MPC1 in the first inverter section 21 are turned on and off, respectively, whereby the electric charge stored on the inverting output terminal 16 and the input node of the second inverter section 22 is discharged through the nMOSFET MNC1. Thus, the potential of the output terminal 16 and the input node of the second inverter section 22 falls from a high level to a low level, whereby pMOSFET MPC2 and nMOSFET MNC2 are turned on and off, respectively. Thus, the output terminal 15 is supplied with electric charge from the VDD power line 12 to assume a high level. In the operation as described above, the electric charge stored on the inverting output terminal 16 and the input node of the second inverter section 22 is discharged to the ground line 11, whereas the electric charge for charging the non-inverting output terminal 15 is supplied from the VDD power line 12.

Assuming that the input signal falls from a high level to a low level in a second case, the initial potential on each terminal is reversed to that in the first case. After the input signal IN falls to a low level, pMOSFET MPC1 and nMOSFET MNC1 in the first inverter section 11 are turned on and off, respectively, whereby the inverting output terminal 16 and the input of the second inverter section 22 are supplied with electric charge from the VDD power line 12 through pMOSFET MPC1 to assume a high level, whereby nMOSFET MNC2 and pMOSFET MPC2 in the second inverter section 22 are turned on and off, respectively. Thus, the electric charge stored on the non-inverting output terminal 15 is discharged to the ground line 11 through nMOSFET MNC2 to assume a low level. In the operation of the second case, the electric charge for charging the inverting output terminal 16 and the input node of the second inverter section 22 is supplied from the VDD power line 12, whereas the electric charge stored on the non-inverting output terminal 15 is discharged to the ground line 11.

In the conventional inverter circuit, the charge for raising the potential on the internal nodes and the output terminals of the inverter circuit is supplied from the power line, whereas all the charge stored on the internal nodes and the output terminals is discharged to the ground line without reuse.

SUMMARY OF THE INVENTION

It is therefore an object of the present invention to provide a low dissipation inverter circuit capable of reusing the charge stored on the internal node or the output terminal of the inverter circuit.

The present invention provides an inverter circuit comprising first and second input terminals for receiving a non-inverting input signal and an inverting input signal, respectively, of a pair of complementary input signals, an inverter block for receiving the input complementary signals through the first and second input terminals to generate a pair of complementary output signals including a non-inverting output signal and an inverting output signal, first and second output terminals for outputting therethrough the non-inverting output signal and the inverting output signal, respectively, a first rectifier section, activated when the inverting input signal is at a high level, for allowing current to flow from the first output terminal to the second output terminal, and a second rectifier section, activated when the non-inverting input signal is at a high level, for allowing current to flow from the second output terminal to the first output terminal.

In accordance with the inverter circuit of the present invention, the charge stored on the higher-potential side of the output terminals can be reused on the lower-potential side of the output terminals at each stage of a signal inversion, to reduce the power dissipation in the inverter circuit.

The above and other objects, features and advantages of the present invention will be more apparent from the following description, referring to the accompanying drawings.

PREFERRED EMBODIMENTS OF THE INVENTION

Figure 1:
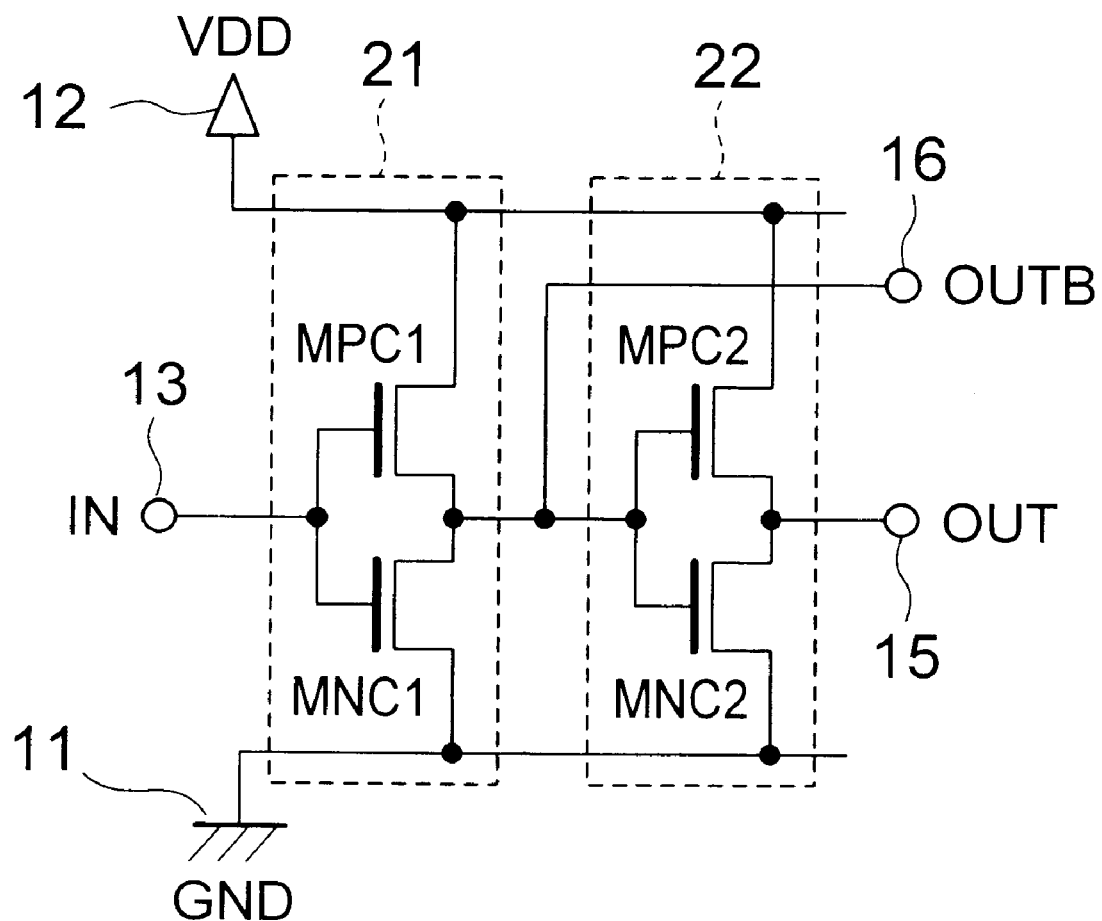
FIG. 1 is a circuit diagram of a conventional inverter circuit.

Now, the present invention is more specifically described based on preferred embodiments thereof with reference to accompanying drawings, wherein similar constituent elements are designated by similar reference numerals.

Figure 2:
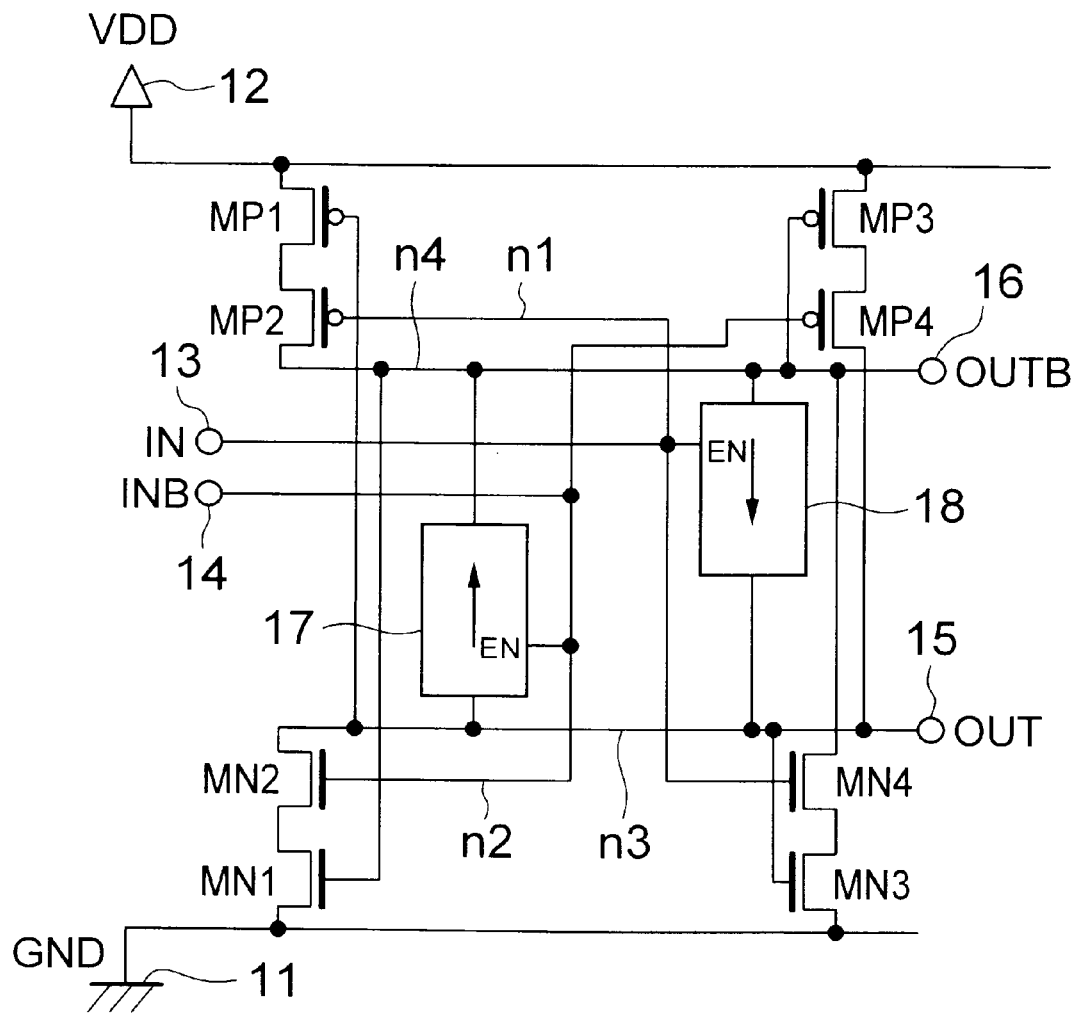
FIG. 2 is a circuit diagram of an inverter circuit according to a typical example of the present invention.

Referring to FIG. 2, there is shown an inverter circuit according to an exemplified principle of the present invention. The inverter circuit is disposed between a VDD power line 12 and the ground line 11 constituting a second power line. The external terminals of the inverter circuit include a non-inverting input terminal 13 for receiving a non-inverting input signal IN, an inverting input terminal 14 for receiving an inverting input signal INB, a non-inverting output terminal 15 for outputting a non-inverting output signal OUT, and an inverting output terminal 16 for outputting an inverting output signal OUTB. The non-inverting input terminal 13, the inverting input terminal 14, the non-inverting output terminal 15 and the inverting output terminal 16 are connected to internal nodes n1, n2, n3 and n4, respectively.

Serially connected pMOSFETs MP1 and MP2 are connected between VDD power line 12 and node n4, whereas serially connected pMOSFETs MP3 and MP4 are connected between the VDD power line 12 and node n3. Serially connected nMOSFETs MN1 and MN2 are connected between the ground line 11 and node n3, whereas serially connected nMOSFETs MN3 and MN4 are connected between the ground line 11 and node n4. A first rectifier section 17 having a switch therein is connected between node n3 and node n4 in a direction for passing current from node n3 to node n4, whereas a second rectifier section 18 having a switch therein is connected between node n3 and n4 in a direction for passing current from node n4 to node n3.

The gates of pMOSFET MP2 and nMOSFET MN4 are connected to the non-inverting input terminal 13 via node n1, the gates of pMOSFET MP4 and nMOSFET Mn2 are connected to the inverting input terminal 14 via node n2, the gates of pMOSFET MP1 and nMOSFET MN3 are connected to the non-inverting output terminal 15 via node n3, and the gates of pMOSFET MP3 and nMOSFET MN1 are connected to the inverting output terminal 16 via node n4.

In the inverter circuit of FIG. 2, pMOSFETs MP1 to MP4 and nMOSFETs MN1 to MN4 form a logic "inversion". Specifically, pMOSFETs MP1 and MP2 and nMOSFETs MN3 and MN4 form a first inverter section having a switching function, wherein input terminal 13, output terminal 15 and output terminal 16 constitute an input, an output and an enable input, respectively, of the first inverter section. On the other hand, pMOSFETs MP3 and MP4 and nMOSFETs MN1 and MN2 constitute a second inverter section having a switching function, wherein input terminal 14, output terminal 15 and output terminal 16 constitute an input, an output and an enable input, respectively, of the second inverter section. Thus, the configuration of the inverter circuit of FIG. 2 is such that a pair of rectifier sections 17 and 18 each having a switching function are provided to the first inverter section and the second inverter section for allowing current flowing between the outputs of these inverter sections in opposite directions.

One of the rectifier sections 17 and 18 is activated by the input signal IN or INB. In this configuration, the inverter circuit of FIG. 2 reuses the electric charge stored on nodes n3 and n4 constituting the output terminals thereof by transferring the electric charge from a higher-potential node to a lower-potential node for power saving.

Figure 3:
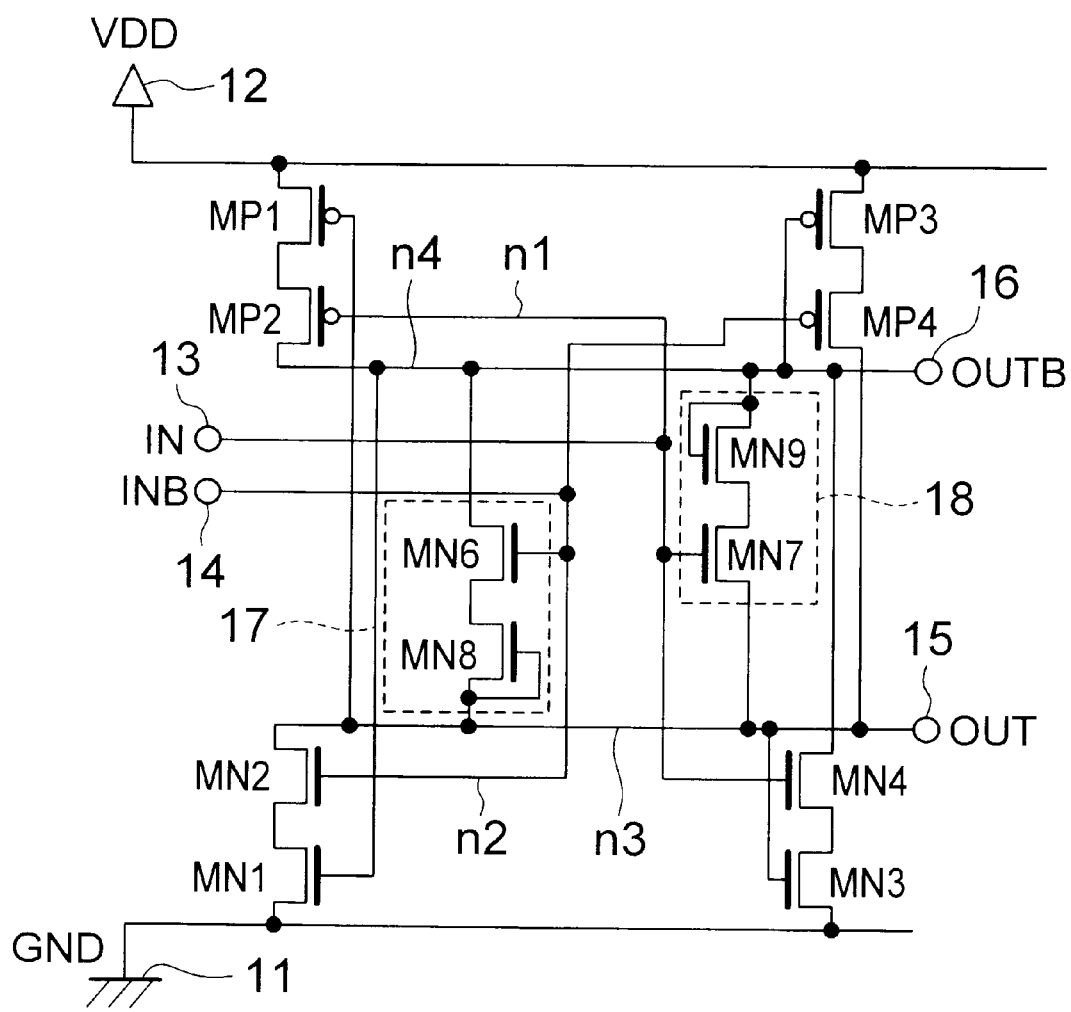
FIG. 3 is a circuit diagram of an inverter circuit according to a first embodiment of the present invention.

Referring to FIG. 3 showing a practical embodiment of the present invention, the first rectifier section 17 shown in FIG. 2 is implemented by a combination of a diode implemented by an nMOSFET MN8 having a gate and a drain connected together and a switching nMOSFET MN6 having a gate for receiving input signal INB. The second rectifier section shown in FIG. 2 is also implemented by a combination of a diode implemented by an nMOSFET MN9 having a gate and a drain connected together and a switching nMOSFET MN9 having a gate for receiving input signal IN.

The nMOSFET MN8, for example, functions based on the relationship between the potential V(OUT) on the output terminal 15 and the potential V(OUTB) on the output terminal 16, as follows:

(1) nMOSFET MN8 allows current to flow from the non-inverting output terminal 15 (node n3) to the inverting output terminal 16 (node n4),
  if V(OUT)–V(OUTB)≧Vth; and (2) nMOSFET MN8 stops current flowing from the non-inverting output terminal 15 to the inverting output terminal 16,
  if V(OUT)–V(OUTB)<Vth, wherein Vth is the threshold voltage of nMOSFET MN8.

The second rectifier section 18 functions for allowing or stopping current to flow from the inverting output terminal 16 to the non-inverting output terminal 15 based on the voltage difference between V(OUT) and V(OUTB).

The operation of the inverter circuit will be described below for the case that the non-inverting is input signal IN rises from a low level to a high level, and therefore, the inverting input signal INB falls from a high level to a low level.

The initial state of the inverter circuit is such that pMOSFET P2 is on, and nMOSFETs MN4 and MN7 are off due to a low level of the input signal IN. The off-state of nMOSFET MN7 inactivates the second rectifier section 18. Similarly, pMOSFET MP4 is off and nMOSFETs MN2 and MN6 are on due to a high level of input signal INB. The on-state of nMOSFET MN6 activates the first rectifier section 17, which functions for setting the potential difference between node n3 and node n4 to be lower than the threshold voltage Vth of the nMOSFET MN8 in a steady state.

The function of the first rectifier section 17 sets the potential on each node of the inverter circuit such that pMOSFET MP1 and nMOSFET MN1 are on and pMOSFET MP3 and nMOSFET MN3 are off. As a result, the initial state of the inverter circuit is such that the potentials on the non-inverting output terminal 15 and the inverting output terminal 16 are low and high, respectively.

After the input signals IN and INB rises and falls, respectively, from the initial state as described above, pMOSFET MP2 and nMOSFETs MN2 and MN6 are turned off, pMOSFET MP4 and nMOSFETs MN4 and MN7 are turned on, and the first and the second rectifier sections 17 and 18 are inactivated and activated, respectively. The second rectifier section 18 functions for allowing current to flow from node n4 to node n3 until the following relationship V(OUTB)−V(OUT)≦Vth holds. At this stage, the electric charge stored on the inverting output terminal 16 is recovered and reused on the non-inverting output terminal 15.

Subsequently, pMOSFET MP3 and nMOSFET MN3 are turned on, so as to raise the potential on node n3 to a VDD potential by the pMOSFETs MP3 and MP4, and to lower the potential on node n4 to the ground potential by the nMOSFETs MN3 and MN4.

Next, a second case, in which input signals In and INB falls and rises, respectively, will be described.

In the initial state, potentials on node n1 and node n3 are at a high level, whereas potentials on node n2 and n4 are at a low level, whereby pMOSFETs MP1 and MP2 are off, pMOSFETs MP3 and MP4 are on, nMOSFETs MN1, MN2 and MN6 are off, and nMOSFETs MN3, MN4 and MN7 are on. The off-state of nMOSFET MN6 and the on-state of nMOSFET MN7 inactivates the first rectifier section 17 and activates the second rectifier section 18, respectively.

After input signals IN and INB falls and rises, respectively, from the initial state as described above, pMOSFET MP2 and nMOSFETs MN2 and MN6 are turned on and pMOSFET MP4 and nMOSFETs MN4 and MN7 are turned off, whereby the first and second rectifier sections 17 and 18 are rendered active and inactive, respectively. The first rectifier section 17 allows current to flow from node n3 to node n4 until the following relationship:

V(OUT)−V(OUTB)≦Vth holds. At this stage, the charge stored on the output terminal 15 in the initial stage is reused on the output terminal 16.

Subsequently, pMOSFET MP1 and nMOSFET MN1 are turned on, to lower the potential on the non-inverting output terminal 15 to the ground potential by the nMOSFETs MN1 and MN2. On the other hand, the potential on the inverting output terminal 16 is raised by pMOSFETs MP1 and MP2 to the VDD potential.

In operation of the inverter circuit of the present embodiment, since the charge stored on one of the output nodes maintained at a higher potential is reused at the stage of a logical inversion of the input signals, as described above, an advantage of lower power dissipation can be achieved.

Figure 4:
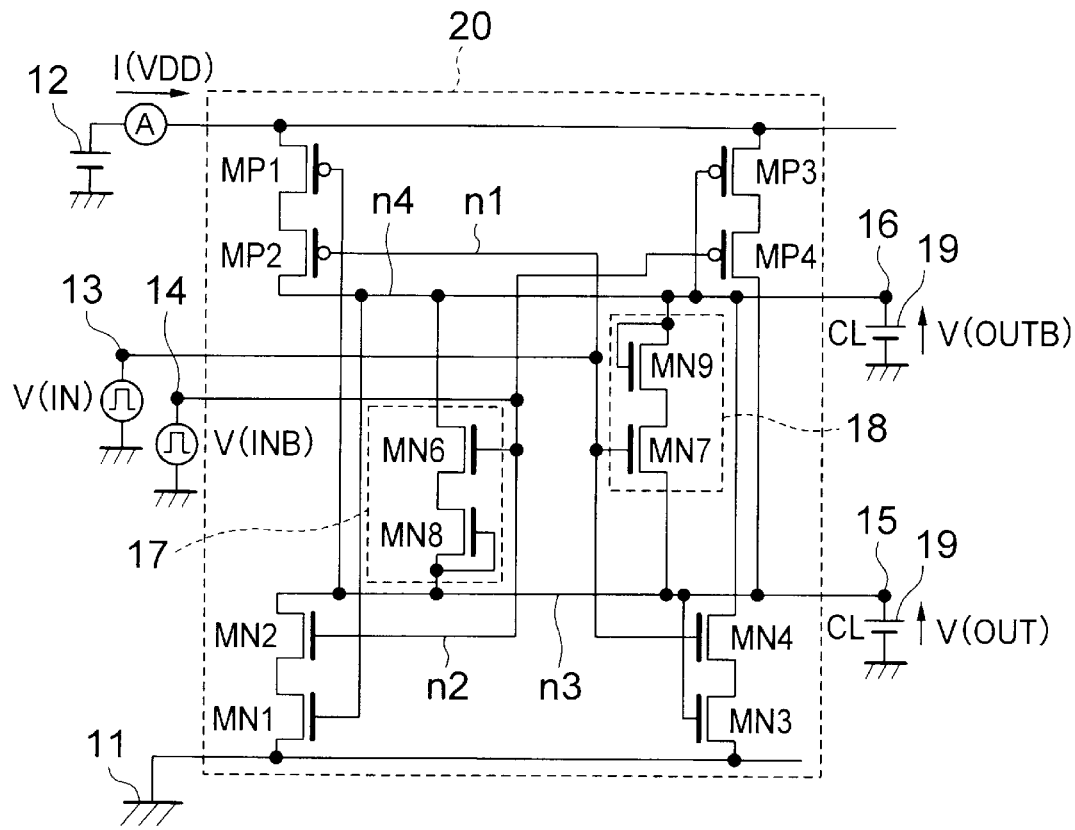
FIG. 4 is a circuit diagram of a practical example used for simulation of the inverter circuit of the first embodiment.

In order to confirm the above advantage, a simulation (first simulation) was performed for evaluating a specific example of the above embodiment such as shown in FIG. 4. The inverter circuit of FIG. 4 has a load capacitor CL connected each output terminal 15 or 16 and the ground 11. A pair of complementary signals V(IN) and V(INB) are applied to respective input terminals 13 and 14.

For the conditions in the simulation, MOSFETs had a gate length of 0.25 μm, pMOSFETs and nMOSFETs had threshold voltages of −0.2 volts and 0.2 volts, VDD source voltage was 2.5 volts. The gate width of pMOSFETs MP1 to MP4 was 10 μm, and the gate width of nMOSFETs MN1 to MN4 was 5 μm. Further, the gate width of nMOSFETs MN6 and MN7 was 20 μm and the gate width of nMOSFETs MN8 and MN9 was 40 μm. The load capacitor CL had a capacitance of 3.0 pF for each of the output terminals 15 and 16.

Figure 5:
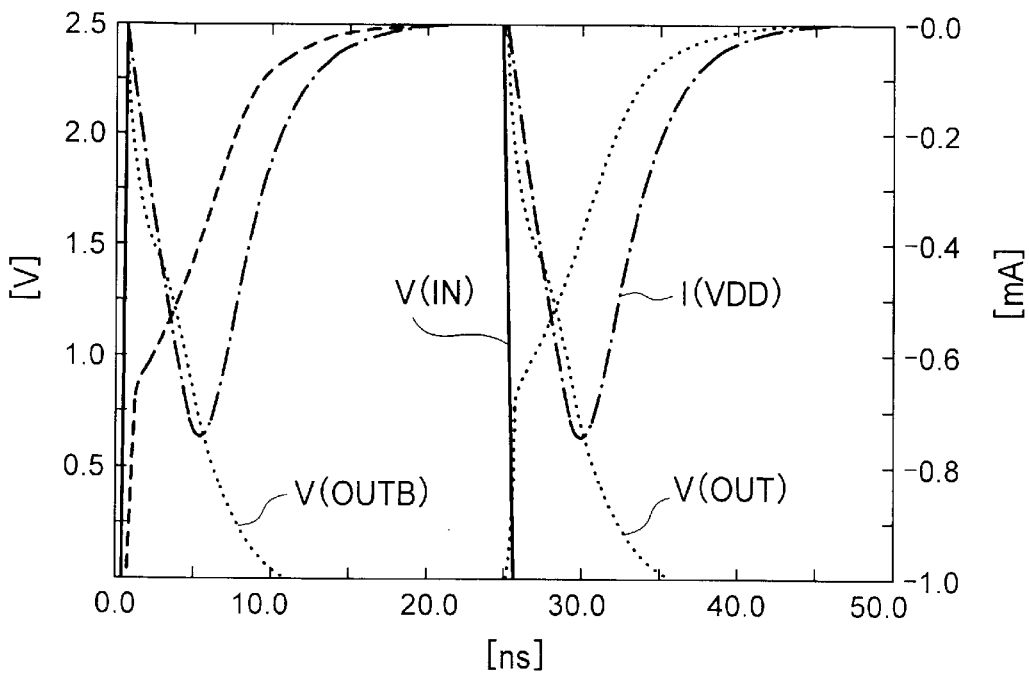
FIG. 5 is a timing chart obtained by simulation of the inverter circuit of FIG. 4.

Referring to FIG. 5, there is shown the results of simulation, wherein waveforms of non-inverting input voltage V(IN), output voltages V(OUT) and V(OUTB) and source current I(VDD) flowing from the VDD power line 12 are depicted. The input voltage V(IN) had a waveform wherein both the rise time and the fall time are 0.5 nanosecond (ns), the pulse repetition period is 50 ns, and the duty ratio is 50%. The inverting input voltage V(INB) had a similar waveform although it is not specifically shown in FIG. 5.

The electric power dissipated by charge/discharge of the output loads in the inverter circuit could be calculated after integration of the source current I(VDD) along time, and amounted to 25.3 μW per MHz for the input pulse train. In the conventional inverter circuit, the corresponding electric power for charge/discharge of a pair of output capacitors of 3.0 pF can be calculated as follows:

$$2 \times CL \times (VDD)^2 \times f$$

$$= 2 \times (3.0 \times 10^{-12}) \times 2.5^2 \times 10^6$$

$$= 37.5 \ \mu W/MHz.$$

Thus, the improvement achieved by the present embodiment is such that the electric power consumed by the inverter circuit of the present embodiment is 67% (25.3/37.5) of that by the conventional inverter circuit.

As shown in FIG. 5, each of the output voltages V(OUT) and V(OUTB) has a slightly moderate slope portion in each of the rising slope and the falling slope, which illustrates the fact of reuse of charge during charge/discharge of the output loads.

Figure 6:
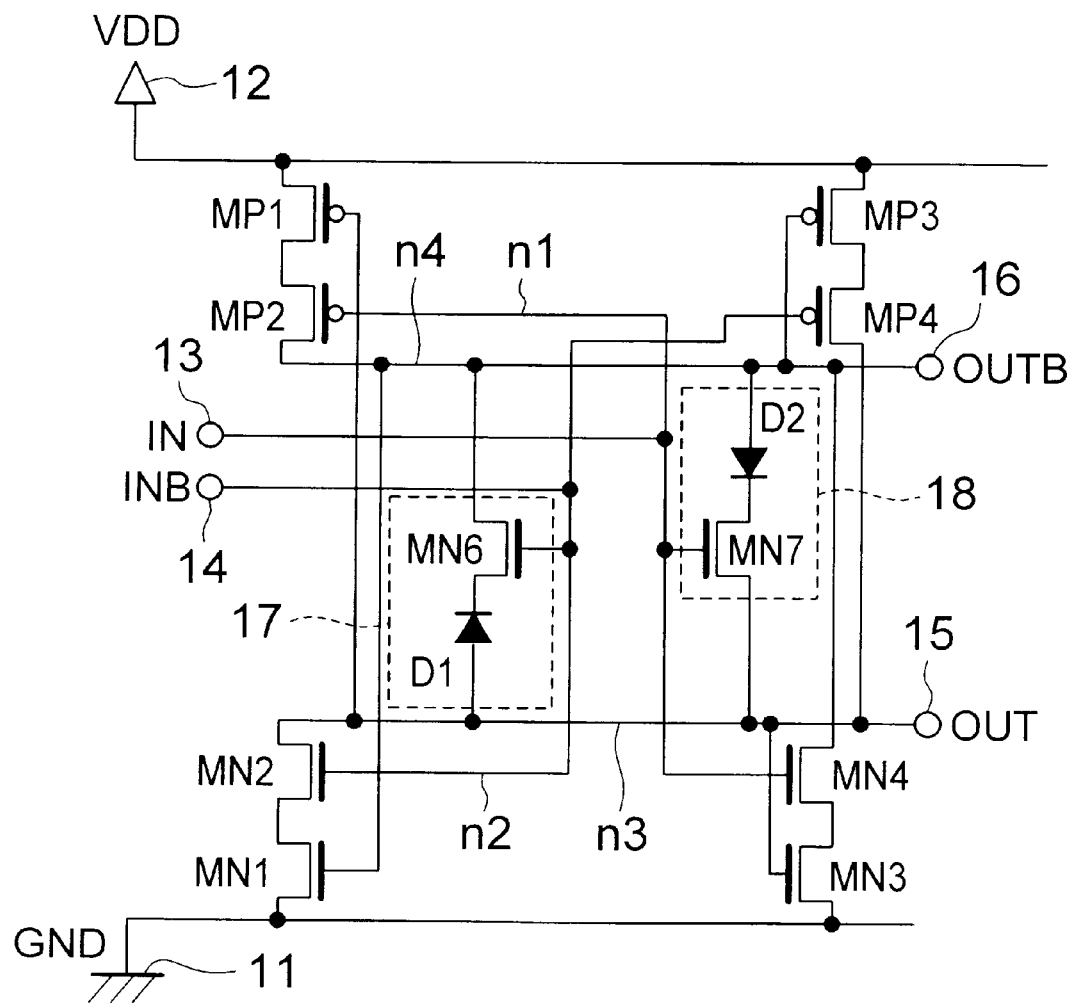
FIG. 6 is a circuit diagram of an inverter circuit according to a second embodiment of the present invention.

Referring to FIG. 6, an inverter circuit according to a second embodiment is similar to the first embodiment except that each of the rectifier sections 17 and 18 in the present embodiment has a diode D1 or D2 instead of nMOSFET MN8 or MN9 having a gate and a drain connected together. The inverter circuit of the present embodiment also can meet the conditions for the simulation as described above.

If the inverter circuit of the present invention is formed on a silicon-on-insulator (SOI) substrate, the parasitic capacitance involved on nodes n3 and n4 can be reduced. This provides a further advantage of a high-speed operation of the inverter circuit. In addition to this configuration, the diode described in Patent Publication JP-A-4-241252 is preferably used in the inverter circuit of the present invention to further improve the inverter circuit to have a smaller occupied area and operate at a high speed. The publication describes a technique for forming low resistance diodes and low resistance resistors, wherein the described diode has a smaller p-n junction capacity.

In the above embodiments, the ratio of reused charge to total charge is limited to 33%, as described above, due to the potential difference appearing between both the terminals of each rectifier section during operation thereof. However, if the total capacitance is balanced between the output terminals 15 and 16, the reuse ratio can be improved up to 50% in an ideal case. For further improvement of the reuse ratio, it is preferable to reduce the potential difference between both the terminals of each of the rectifier sections 17 and 18 during operation thereof.

Figure 7:
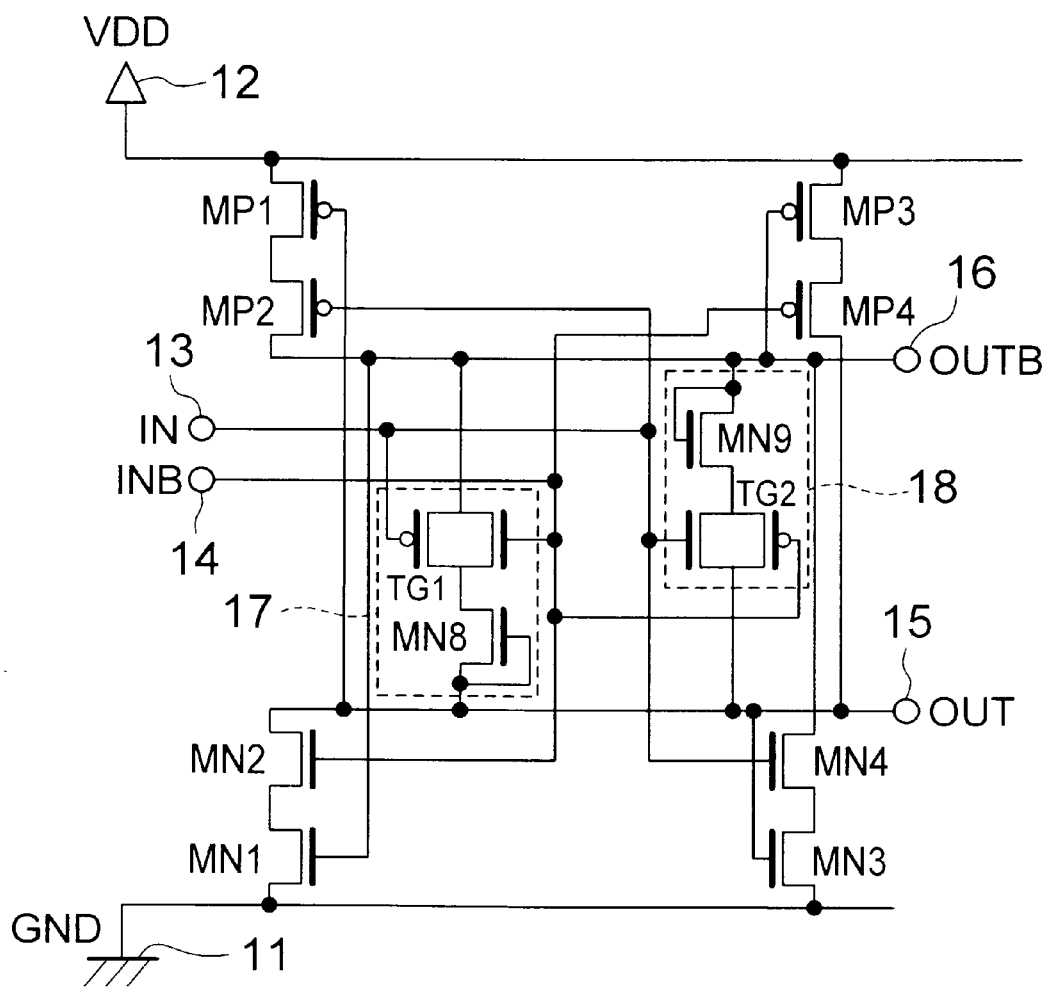
FIG. 7 is a circuit diagram of an inverter circuit according to a third embodiment of the present invention.

Referring to FIG. 7, an inverter circuit according to a third embodiment of the present invention is similar to the first embodiment except that each of the rectifier sections 17 and 18 includes a CMOS transfer gate TG1 or TG2 instead of the nMOSFET MN6 or MN7. The CMOS transfer gate TG1 or TG2 as used herein has a voltage drop across the rectifier section 17 or 18 which is lower than that of the rectifier section in the first and the second embodiments. This improves the reuse ratio in the present embodiment.

A second simulation was performed for the inverter circuit of FIG. 7 wherein each of the transfer gates TG1 and TG2 was implemented by a pMOSFET having a gate width of 20 μm and an nMOSFET having a gate width of 10 μm connected in parallel with each other. Other conditions were similar to those in the first simulation. The result of the second simulation exhibited about 5% improvement over the result obtained by the first simulation.

Since the above embodiments are described only for examples, the present invention is not limited to the above embodiments and various modifications or alterations can be easily made therefrom by those skilled in the art without departing from the scope of the present invention.

What is claimed is:

1. An inverter circuit comprising first and second input terminals for receiving a non-inverting input signal and an inverting input signal, respectively, of a pair of complementary input signals, an inverter block for receiving said input complementary signals through said first and second input terminals to generate a pair of complementary output signals including a non-inverting output signal and an inverting output signal, first and second output terminals for outputting therethrough said non-inverting output signal and said inverting output signal, respectively, a first rectifier section, activated when said inverting input signal is at a high level, for allowing current to flow from said first output terminal to said second output terminal, and a second rectifier section, activated when said non-inverting input signal is at a high level, for allowing current to flow from said second output terminal to said first output terminal.

2. The inverter circuit as defined in claim 1, wherein each of said first and second rectifier sections comprises a switching transistor activated by a high level of one of said complementary input signals, and a diode connected in series with said switching transistor.

3. The inverter circuit as defined in claim 2, wherein each said diode comprises an nMOSFET having a gate and a drain connected together.

4. The inverter circuit as defined in claim 2, wherein each said switching transistor comprises an nMOSFET having a gate for receiving one of said complementary input signals.

5. The inverter circuit as defined in claim 2, wherein each said switching transistor comprises a transfer gate.

6. The inverter circuit as defined in claim 1, wherein said inverter circuit is formed on a silicon-on-insulator substrate.

7. The inverter circuit as defined in claim 1, wherein said inverter block comprises first and second pMOSFETs connected between a first power line and said second output terminal, third and fourth pMOSFETs connected between said first power line and said first output terminal, first and second nMOSFETs connected between a second power line and said first output terminal, and third and fourth nMOSFETs connected between said second power line and said second output terminal.

8. The inverter circuit as defined in claim 7, wherein each of said first pMOSFET and said third nMOSFET has a gate connected to said first output terminal, each of said second pMOSFET and said fourth nMOSFET has a gate connected to said first input terminal, each of said third pMOSFET and said first nMOSFET has a gate connected to said second output terminal, and each of said fourth pMOSFET and said second nMOSFET has a gate connected to said second input terminal.

\* \* \* \* \*